United States Patent
Lo et al.

(10) Patent No.: US 11,894,100 B2
(45) Date of Patent: Feb. 6, 2024

(54) DATA SERIALIZER, LATCH DATA DEVICE USING THE SAME AND CONTROLLING METHOD THEREOF

(71) Applicant: MACRONIX INTERNATIONAL CO., LTD., Hsinchu (TW)

(72) Inventors: Su-Chueh Lo, Hsinchu (TW); Yi-Fan Chang, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 75 days.

(21) Appl. No.: 17/572,674

(22) Filed: Jan. 11, 2022

(65) Prior Publication Data

US 2023/0223058 A1   Jul. 13, 2023

(51) Int. Cl.
   *G11C 7/10*   (2006.01)

(52) U.S. Cl.
   CPC ............ *G11C 7/1087* (2013.01); *G11C 7/106* (2013.01); *G11C 7/1057* (2013.01); *G11C 7/1084* (2013.01)

(58) Field of Classification Search
   CPC ..... G11C 7/1087; G11C 7/1057; G11C 7/106; G11C 7/1084
   See application file for complete search history.

(56) References Cited

U.S. PATENT DOCUMENTS

| | | | |
|---|---|---|---|
| 10,419,202 B2* | 9/2019 | Lee | H04L 7/0041 |
| 2006/0250163 A1 | 11/2006 | Morzano | |
| 2013/0038350 A1 | 2/2013 | Du et al. | |
| 2013/0249612 A1 | 9/2013 | Zerbe et al. | |
| 2022/0103176 A1* | 3/2022 | Hwang | G11C 7/1084 |

FOREIGN PATENT DOCUMENTS

KR       20030003389 A       1/2003

* cited by examiner

*Primary Examiner* — Ajay Ojha
(74) *Attorney, Agent, or Firm* — McClure, Qualey & Rodack, LLP

(57) ABSTRACT

A data serializer, a latch data device using the same and a controlling method thereof are provided. The data serializer includes at least one data buffer and a de-skew buffer. The data buffer at least receives an inputting data and a controlling signal. An outputting signal and a complementary outputting signal, which is complementary to the outputting signal, are formed when the controlling signal is at a predetermined level. The de-skew buffer receives the complementary outputting signal to accelerate or slow down forming the outputting signal.

21 Claims, 14 Drawing Sheets

| DA | C | Dout |
|---|---|---|
| 0 | 0 | Z |
| 1 | 0 | Z |
| 0 | 1 | 0 |
| 1 | 1 | 1 |

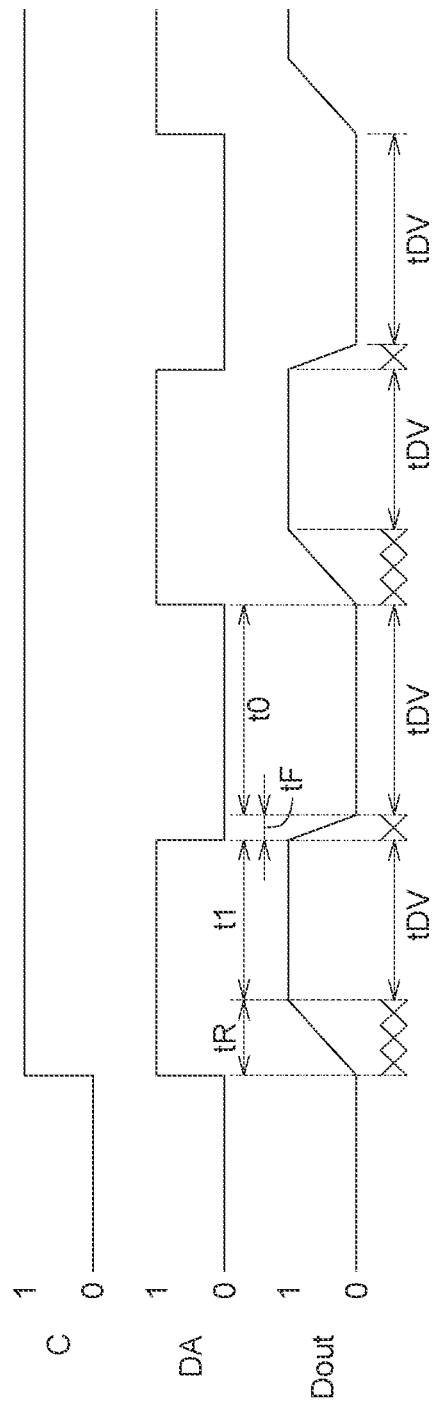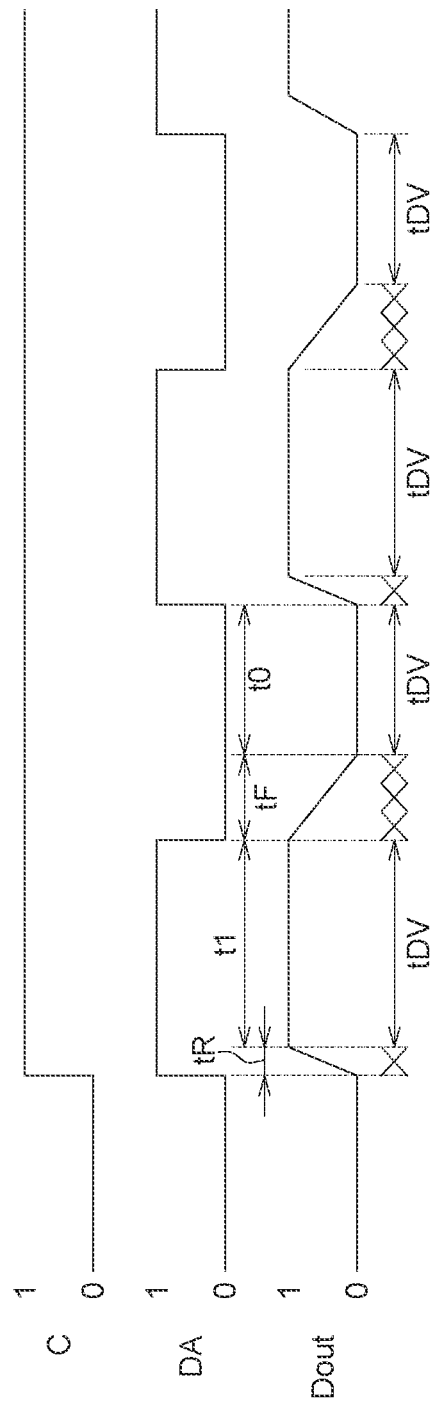

| DA | C | Dout | Doutb |
|---|---|---|---|
| 0 | 0 | Z | Z |
| 1 | 0 | Z | Z |
| 0 | 1 | 0 | 1 |
| 1 | 1 | 1 | 0 |

DATA SERIALIZER, LATCH DATA DEVICE USING THE SAME AND CONTROLLING METHOD THEREOF

TECHNICAL FIELD

The disclosure relates in general to an electronic component, an electric device using the same and a controlling method thereof, and more particularly to a data serializer, a latch data device using the same and a controlling method thereof.

BACKGROUND

Along with the development of the semiconductor technology, several kinds of electric components are invented. For example, data buffers are widely used in the latch data device. The data buffer outputs data of "0" or "1" when an enable port is inputted a controlling signal of "1." The data buffer disables output (or output "Hi-Z") when the enable port is inputted the controlling signal of "0."

In the data buffer, an outputting signal is raised to be "1" or fallen to be "0." When the outputting signal is being raised or fallen, the content is invalid. In case of the raising time is longer than the falling time, the time period of "1" will be shorter than the time period of "0" under the controlling signal having fixed cycle time. In case of the raising time is shorter than the falling time, the time period of "1" will be longer than the time period of "0" under the controlling signal having fixed cycle time.

To accurately read the content "0" or "1" of the outputting signal, a data valid window excluded the union of the raising time and the falling time is used. The content "0" or "1" read at the data valid window is accurate. The difference between the raising time and the falling time greatly affects the size of the data valid window.

SUMMARY

The disclosure is directed to a data serializer, a latch data device using the same and a controlling method thereof. A de-skew buffer is used to receive a complementary outputting signal to accelerate or slow down forming an outputting signal. Therefore, the raising time and the falling time of the outputting signal become substantially identical. Because the difference between the raising time and the falling time is greatly reduced, so the size of a data valid window can be greatly increased.

According to one embodiment, a data serializer is provided. The data serializer includes at least one data buffer and a de-skew buffer. The data buffer at least receives an inputting data and a controlling signal. An outputting signal and a complementary outputting signal, which is complementary to the outputting signal, are formed when the controlling signal is at a predetermined level. The de-skew buffer receives the complementary outputting signal to accelerate or slow down forming the outputting signal.

According to another embodiment, a latch data device is provided. The latch data device includes a latch circuit and an output transmitter. The output transmitter is connected to the latch circuit. The output transmitter includes a data serializer. The data serializer includes at least one data buffer and a de-skew buffer. The data buffer receives an inputting data and a controlling signal. An outputting signal and a complementary outputting signal, which is complementary to the outputting signal, are formed when the controlling signal is at a predetermined level. The de-skew buffer receives the complementary outputting signal to accelerate or slow down forming the outputting signal.

According to another embodiment, a controlling method of a data serializer is provided. The data serializer includes at least one data buffer and a de-skew buffer. The controlling method comprises the following steps. The data buffer receives an inputting data and a controlling signal. The data buffer forms an outputting signal and a complementary outputting signal, which is complementary to the outputting signal, when the controlling signal is at a predetermined level. The de-skew buffer receives the complementary outputting signal to accelerate or slow down forming the outputting signal.

BRIEF DESCRIPTION OF THE DRAWINGS

FIG. 4A shows voltage curves of a controlling signal, an inputting data and an outputting signal of the data buffer in the case that the PMOS transistors work slower than the NMOS transistors.

FIG. 4B shows voltage curves of the controlling signal, the inputting data and the outputting signal of the data buffer in the case that the PMOS transistors work faster than the NMOS transistors.

Figures 1, 2:
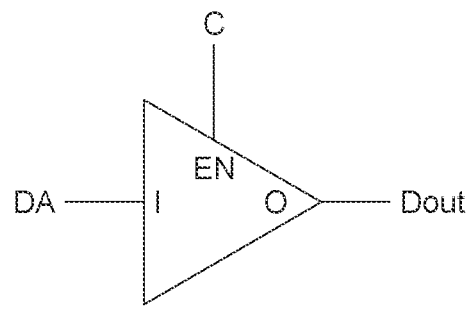
FIG. 1 shows a data buffer according to one embodiment.
FIG. 2 shows a logic table of the data buffer.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Referring to FIG. 1, a data buffer TB1 according to one embodiment is shown. The data buffer TB1 is, for example, a tri-state buffer TB1. The data buffer TB1 has an input port I, an enable port EN and an output port O. A controlling signal C is inputted to the enable port EN. An inputting data DA is inputted to the input port I. An outputting signal Dout is outputted from the output port O.

Please refer to FIG. 2, which shows a logic table of the data buffer TB1. The controlling signal C inputted to the enable port EN is "1" when it is at a predetermined level; the controlling signal C inputted to the enable port EN is "0", when it is lower than the predetermined level. The output port O of the data buffer TB1 outputs the outputting signal Dout of "0" or "1" according to the inputting data DA inputted to the input port I when the controlling signal C inputted to the enable port EN is "1." The data buffer TB1 disables output (or output "Hi-Z") when the controlling signal C inputted to the enable port EN is "0."

Figure 3:
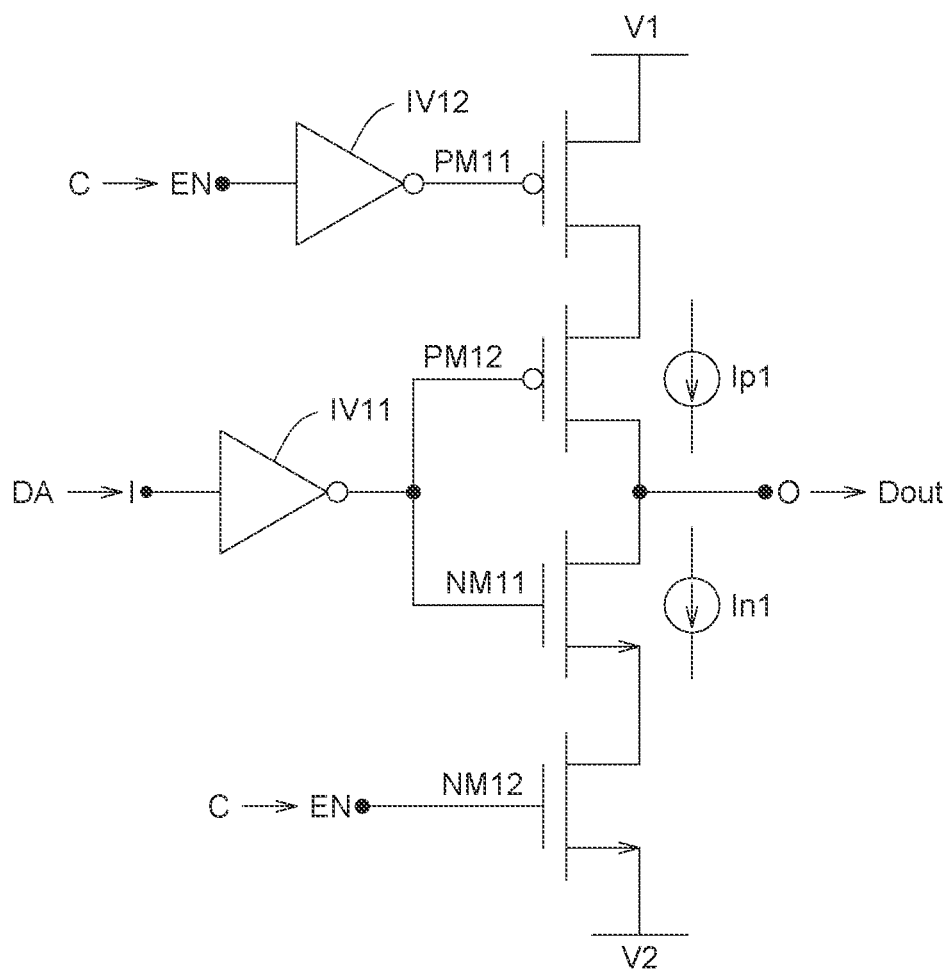
FIG. 3 shows a circuit diagram of the data buffer according to one embodiment.

Please refer to FIG. 3, which shows a circuit diagram of the data buffer TB1 according to one embodiment. The data buffer TB1 includes a PMOS transistor PM11, a PMOS transistor PM12, a NMOS transistor NM11, a NMOS transistor NM12, an inverter IV11 and an inverter IV12. The PMOS transistor PM11, the PMOS transistor PM12, the NMOS transistor NM11 and the NMOS transistor NM12 are connected in series. The drain (or the source) of the PMOS transistor PM11 is applied a first voltage V1. The first voltage V1 is, for example, a drain voltage or a source voltage. The source of the NMOS transistor NM12 is applied a second voltage V2. The inverter IV11 is connected to the input port I. The gate of the PMOS transistor PM12 and the gate of the NMOS transistor NM11 are connected to the inverter IV11. The inverter IV12 is connected between the enable port EN and the gate of the PMOS transistor PM11. The source (or the drain) of the PMOS transistor PM12 and the drain of the NMOS transistor NM11 are connected to the output port O.

When the controlling signal C inputted to the enable port EN is "0", the PMOS transistor PM11 and the NMOS transistor NM12 are turned off. So, the current Ip1 or the current In1 will not be formed, and the data buffer TB1 disables output (or output "Hi-Z").

When the controlling signal C inputted to the enable port EN is "1" and the inputting data DA inputted to the input port I is "1", the PMOS transistor PM11 and the PMOS transistor PM12 are turned on, and the NMOS transistor NM11 is turned off. So the current Ip1 will be formed, and the outputting signal Dout outputted from the output port O is raised to "1" which is identical to the inputting data DA.

When the controlling signal C inputted to the enable port EN is "1" and the inputting data DA inputted to the input port I is "0", the NMOS transistor NM11 and the NMOS transistor NM12 are turned on and the PMOS transistor PM12 is turned off. So the current In1 will be formed, and the outputting signal Dout outputted from the output port O is fallen to "0" which is identical to the inputting data DA.

Please refer to FIG. 4A, which shows voltage curves of the controlling signal C, the inputting data DA and the outputting signal Dout of the data buffer TB1 in the case that the PMOS transistors PM11, PM12 work slower than the NMOS transistors NM11, NM12. As shown in FIG. 4A, the raising time tR of the outputting signal Dout is longer than the falling time tF of the outputting signal Dout, so the time period t1 of "1" is shorter than the time period t0 of "0."

To accurately read the content "0" or "1" of the outputting signal Dout, a data valid window tDV excluded the union of the raising time tR and the falling time tF is used. The content "0" or "1" read at the data valid window tDV is accurate. The difference between the raising time tR and the falling time tF greatly affects the size of the data valid window tDV.

Please refer to FIG. 4B, which shows voltage curves of the controlling signal C, the inputting data DA and the outputting signal Dout of the data buffer TB1 in the case that the PMOS transistors PM11, PM12 work faster than the NMOS transistors NM11, NM12. As shown in FIG. 4B, the raising time tR of the outputting signal Dout is shorter than the falling time tF of the outputting signal Dout, so the time period t1 of "1" will be longer than the time period t0 of "0."

To accurately read the content "0" or "1" of the outputting signal Dout, the data valid window tDV excluded the union of the raising time tR and the falling time tF is used. The content "0" or "1" read at the data valid window tDV is accurate. The difference between the raising time tR and the falling time tF greatly affects the size of the data valid window tDV.

The data buffer TB1 is widely used in electric devices and latch data devices. For example, one or more data buffers TB1 may be used in a data serializer.

Figures 5, 6:
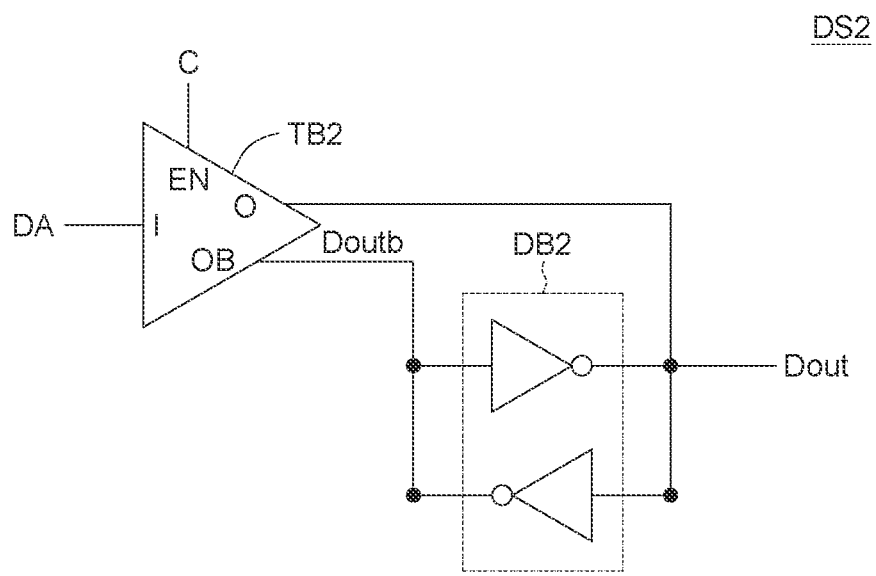
FIG. 5 shows a data serializer according to one embodiment.
FIG. 6 shows a logic table of the data serializer.

Please refer to FIG. 5, which shows a data serializer DS2 according to one embodiment. The data serializer DS2 includes a data buffer TB2 and a de-skew buffer DB2. The operation and the controlling method of the data serializer DS2 are described as follows. The data buffer TB2 at least receives the inputting data DA and the controlling signal C. The outputting signal Dout and a complementary outputting signal Doutb, which is complementary to the outputting signal Dout, are formed when the controlling signal C is at the predetermined level, i.e. "1." The de-skew buffer DB2 receives the complementary outputting signal Doutb to accelerate or slow down forming the outputting signal Dout.

Please refer to FIG. 6, which shows a logic table of the data serializer DS2. The controlling signal C inputted to the enable port EN is "1" when it is at a predetermined level; the controlling signal C inputted to the enable port EN is "0", when it is lower than the predetermined level. The output port O of the data buffer TB2 outputs the outputting signal Dout of "0" or "1" according to the inputting data DA inputted to the input port I when the controlling signal C inputted to the enable port EN is "1." The output port OB of the data buffer TB2 outputs the complementary outputting signal Doutb of "1" or "0" according to complementary value of the inputting data DA inputted to the input port I when the controlling signal C inputted to the enable port EN is "1." The data buffer TB2 disables output (or output "Hi-Z") when the controlling signal C inputted to the enable port EN is "0."

Figure 7:
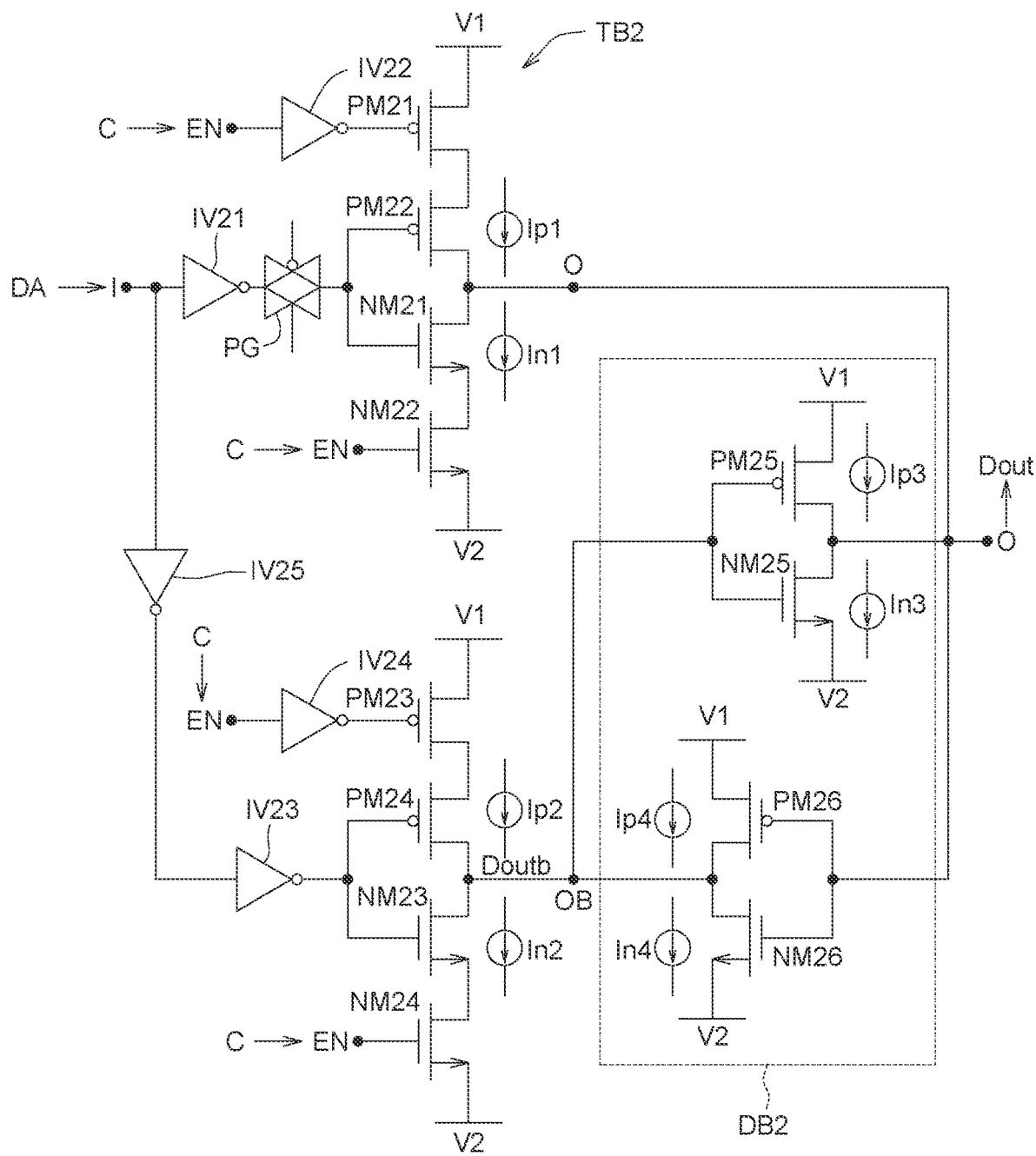
FIG. 7 shows a circuit diagram of the data serializer according to one embodiment.

Refer to FIG. 7, which shows a circuit diagram of the data serializer DS2 according to one embodiment. The data buffer TB2 includes a PMOS transistor PM21, a PMOS transistor PM22, a NMOS transistor NM21, a NMOS transistor NM22, an inverter IV21, a pass gate (buffer gate) PG, an inverter IV22, a PMOS transistor PM23, a PMOS transistor PM24, a NMOS transistor NM23, a NMOS transistor NM24, an inverter IV23, an inverter IV24 and an inverter IV25. The PMOS transistor PM21, the PMOS transistor PM22, the NMOS transistor NM21 and the NMOS transistor NM22 are connected in series. The drain (or the source) of the PMOS transistor PM21 is applied the first voltage V1. The first voltage V1 is, for example, a drain voltage or a source voltage. The source of the NMOS transistor NM22 is applied the second voltage V2. The inverter IV21 is connected to the input port I. The pass gate PG is connected to the inverter IV21 and used for supplementing the delay of the inverter IV23. The function of the pass gate PG is to make the inputting data DA entering the gate of the PMOS transistor PM22/the NMOS transistor NM21 and entering the gate of the PMOS transistor PM24/the NMOS transistor NM23 at the same time. The gate of the PMOS transistor PM22 and the gate of the NMOS transistor NM21 are connected to the pass gate PG. The inverter IV22 is connected between the enable port EN and the gate of the PMOS transistor PM21. The source (or the drain) of the PMOS transistor PM22 and the drain of the NMOS transistor NM21 are connected to the output port O.

The PMOS transistor PM23, the PMOS transistor PM24, the NMOS transistor NM23 and the NMOS transistor NM24 are connected in series. The drain (or the source) of the PMOS transistor PM23 is applied the first voltage V1. The first voltage V1 is, for example, a drain voltage or a source voltage. The source of the NMOS transistor NM24 is applied the second voltage V2. The inverter IV25 is connected to the input port I. The inverter IV23 is connected to the inverter IV25. The gate of the PMOS transistor PM24 and the gate of the NMOS transistor NM23 are connected to the inverter IV23. The inverter IV24 is connected between the enable port EN and the gate of the PMOS transistor PM23. The source (or the drain) of the PMOS transistor PM24 and the drain of the NMOS transistor NM23 are connected to the output port OB.

When the controlling signal C inputted to the enable port EN is "0", the PMOS transistor PM21 and the NMOS transistor NM22 are turned off. So, the current Ip1 or the current In1 will not be formed.

When the controlling signal C inputted to the enable port EN is "0", the PMOS transistor PM23 and the NMOS transistor NM24 are turned off. So, a current Ip2 or a current In2 will not be formed.

When the controlling signal C inputted to the enable port EN is "1" and the inputting data DA inputted to the input port I is "1", the PMOS transistor PM21 and the PMOS transistor PM22 are turned on, and the NMOS transistor NM21 is turned off. So the current Ip1 will be formed, and the outputting signal Dout outputted from the output port O is raised to "1" which is identical to the inputting data DA.

When the controlling signal C inputted to the enable port EN is "1" and the inputting data DA inputted to the input port I is "1", the NMOS transistor NM23 and the NMOS transistor NM24 are turned on, and the PMOS transistor PM24 is turned off. So the current In2 will be formed, and the complementary outputting signal Doutb outputted from the output port OB is fallen to "0" which is complementary to the inputting data DA.

When the controlling signal C inputted to the enable port EN is "1" and the inputting data DA inputted to the input port I is "0", the NMOS transistor NM21 and the NMOS transistor NM22 are turned on, and the PMOS transistor PM22 is turned off. So the current In1 will be formed, and the outputting signal Dout outputted from the output port O is fallen to "0" which is identical to the inputting data DA.

When the controlling signal C inputted to the enable port EN is "1" and the inputting data DA inputted to the input port I is "0", the PMOS transistor PM23 and the PMOS transistor PM24 are turned on, and the NMOS transistor NM23 is turned off. So the current Ip2 will be formed, and the complementary outputting signal Doutb outputted from the output port OB is raised to "1" which is complementary to the inputting data DA.

The de-skew buffer DB2 includes a PMOS transistor PM25, a NMOS transistor NM25, a PMOS transistor PM26 and a NMOS transistor NM26. The PMOS transistor PM25 and the NMOS transistor NM25 are connected in series. The drain (or source) of the PMOS transistor PM25 is applied the first voltage V1. The first voltage V1 is, for example, a drain voltage or a source voltage. The source of the NMOS transistor NM25 is applied the second voltage V2. The gate of the PMOS transistor PM25 and the gate of NMOS transistor NM25 are connected to the output port OB. The source (or the drain) of the PMOS transistor PM25 and the drain of the NMOS transistor NM25 are connected to the output port O.

The PMOS transistor PM26 and the NMOS transistor NM26 are connected in series. The drain (or source) of the PMOS transistor PM26 is applied the first voltage V1. The first voltage V1 is, for example, a drain voltage or a source voltage. The source of the NMOS transistor NM26 is applied the second voltage V2. The source (or the drain) of the PMOS transistor PM26 and the drain of the NMOS transistor NM26 are connected to the output port OB. The gate of the PMOS transistor PM26 and the gate of NMOS transistor NM26 are connected to the output port O.

Figure 8A:
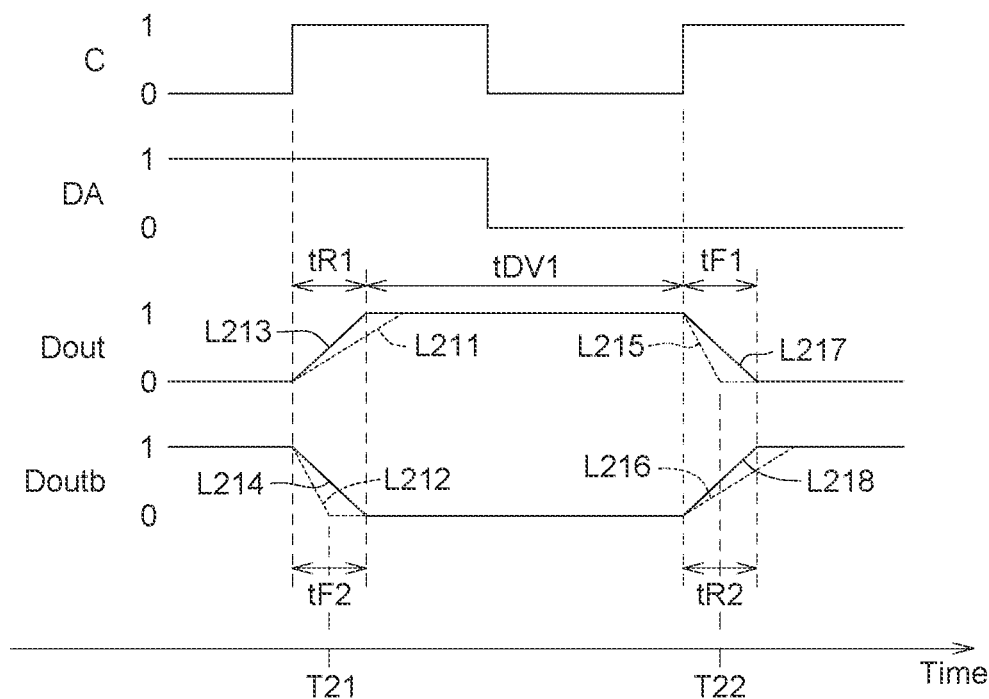
FIG. 8A shows voltage curves of the controlling signal, the inputting data, the outputting signal and a complementary outputting signal of a data serializer in the case that PMOS transistors work slower than NMOS transistors.

Please refer to FIG. 8A, which shows voltage curves of the controlling signal C, the inputting data DA, the outputting signal Dout and the complementary outputting signal Doutb of the data serializer DS2 in the case that the PMOS transistors PM21, PM22, PM23, PM24, PM25, PM26 work slower than the NMOS transistors NM21, NM22, NM23, NM24, NM25, NM26.

Referring to dotted lines L211, L215 in FIG. 8A, the raising of the outputting signal Dout is slower than the falling of the outputting signal Dout. When the outputting signal Dout is being slowly raised, the complementary outputting signal Doutb is being rapidly fallen. At time point T21, the complementary outputting signal Doutb first reach "0", so the PMOS transistor PM25 of the de-skew buffer DB2 is turned on by the complementary outputting signal Doutb. Further, at the time point T21, the outputting signal Dout is still at "0", so the PMOS transistor PM26 of the de-skew buffer DB2 is turned on by the outputting signal Dout. After the PMOS transistor PM25 is turned on, a current Ip3 is provided to pull the outputting signal Dout high; after the PMOS transistor PM26 is turned on, a current Ip4 is provided to inhibit the complementary outputting signal Doutb (to pull the complementary outputting signal Doutb high). Therefore, referring to solid lines L213, L214, forming the outputting signal Dout is accelerated and forming the complementary outputting signal Doutb is slowed down.

Referring to dotted lines L215, L216 in FIG. 8A, when the outputting signal Dout is being rapidly fallen, the complementary outputting signal Doutb is being slowly raised. At time point T22, the complementary outputting signal Doutb is still at "0", so the PMOS transistor PM25 of the de-skew buffer DB2 is turned on by the complementary outputting signal Doutb. Further, at the time point T22, the outputting signal Dout first reaches "0", so the PMOS transistor PM26 of the de-skew buffer DB2 is turned on by the outputting signal Dout. After the PMOS transistor PM25 is turned on, the current Ip3 is provided to pull the outputting signal Dout high; after the PMOS transistor PM26 is turned on, the current Ip4 is provided to inhibit the complementary outputting signal Doutb (to pull the complementary outputting signal Doutb high). Therefore, referring to solid lines L217, L218, forming the outputting signal Dout is slowed down and forming the complementary outputting signal Doutb is accelerated.

As such, the raising time tR1, the falling time tF1 of the outputting signal Dout and the raising time tR2, the falling time tF2 of the complementary outputting signal Doutb become substantially identical. Because the difference between the raising time tR1 and the falling time tF1 is greatly reduced, so the size of a data valid window tDV1 can be greatly increased.

Figure 8B:
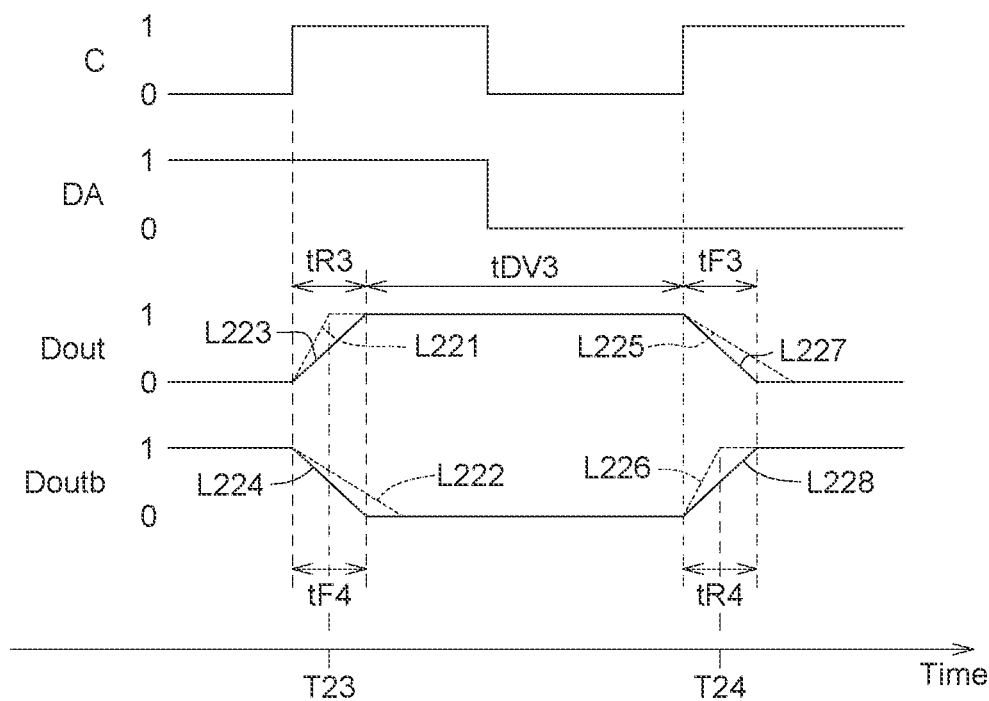
FIG. 8B shows voltage curves of the controlling signal, the inputting data, the outputting signal and the complementary outputting signal of the data serializer in the case that the PMOS transistors work faster than the NMOS transistors.

Please refer to FIG. 8B, which shows voltage curves of the controlling signal C, the inputting data DA, the outputting signal Dout and the complementary outputting signal Doutb of the data serializer DS2 in the case that the PMOS transistors PM21, PM22, PM23, PM24, PM25, PM26 work faster than the NMOS transistors NM21, NM22, NM23, NM24, NM25, NM26.

Referring to dotted lines L221, L225 in FIG. 8B, the raising of the outputting signal Dout is faster than the falling of the outputting signal Dout. When the outputting signal Dout is being rapidly raised, the complementary outputting signal Doutb is being slowly fallen. At time point T23, the complementary outputting signal Doutb is still at "1", so the NMOS transistor NM25 of the de-skew buffer DB2 is turned on by the complementary outputting signal Doutb. Further, at the time point T23, the outputting signal Dout first reaches "1", so the NMOS transistor NM26 of the de-skew buffer DB2 is turned on by the outputting signal Dout. After the NMOS transistor NM25 is turned on, a current In3 is provided to pull the outputting signal Dout down; after the NMOS transistor NM26 is turned on, a current In4 is provided to inhibit the complementary outputting signal Doutb (to pull the complementary outputting signal Doutb down). Therefore, referring to solid lines L223, 1224, forming the outputting signal Dout is slowed down and forming the complementary outputting signal Doutb is accelerated.

Referring to dotted lines 1225, L226 in FIG. 8B, when the outputting signal Dout is being slowly fallen, the complementary outputting signal Doutb is being rapidly raised. At time point T24, the complementary outputting signal Doutb first reaches "1", so the NMOS transistor NM25 of the de-skew buffer DB2 is turned on by the complementary outputting signal Doutb. Further, at the time point T24, the outputting signal Dout is still at "1", so the NMOS transistor NM26 of the de-skew buffer DB2 is turned on by the outputting signal Dout. After the NMOS transistor NM25 is turned on, the current In3 is provided to pull the outputting signal Dout down; after the NMOS transistor NM26 is turned on, the current In4 is provided to inhibit the complementary outputting signal Doutb (to pull the complementary outputting signal Doutb down). Therefore, referring to solid lines L227, L228, forming the outputting signal Dout is accelerated and forming the complementary outputting signal Doutb is slowed down.

As such, the raising time tR3, the falling time tF3 of the outputting signal Dout and the raising time tR4, the falling time tF4 of the complementary outputting signal Doutb become substantially identical. Because the difference between the raising time tR3 and the falling time tF3 is greatly reduced, so the size of a data valid window tDV3 can be greatly increased.

Figure 9:
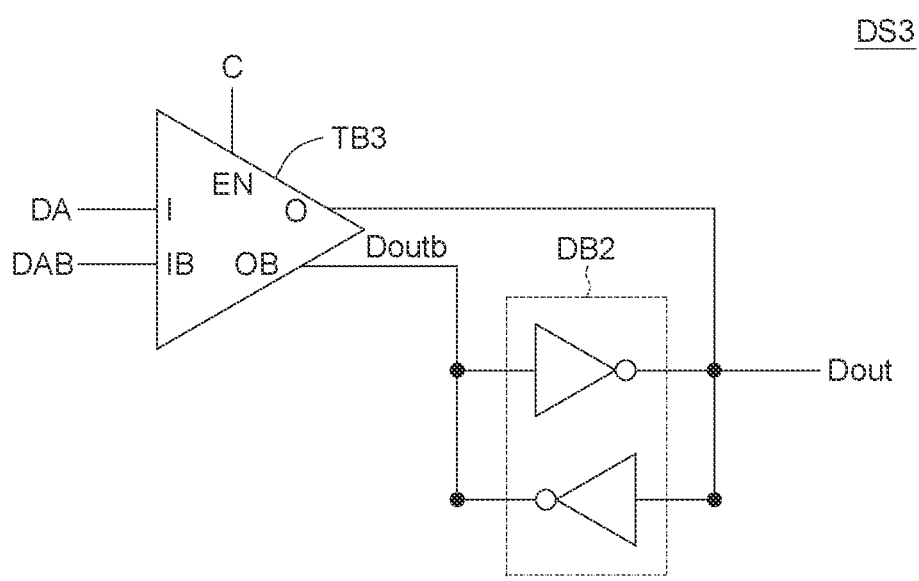
FIG. 9 shows a data serializer according to another embodiment.

Please refer to FIG. 9, which shows a data serializer DS3 according to another embodiment. In this embodiment, the data serializer DS3 includes a data buffer TB3 and the de-skew buffer DB2. The structure of the data buffer TB3 is similar to that of the data buffer TB2, so the similarities are not repeated here. Compared to the data buffer TB2, the data buffer TB3 further has an input port IB. The inputting data DA is inputted to the input port I, and a complementary inputting data DAB is inputted to the input port IB. The complementary inputting data DAB is complementary to the inputting data DA.

Figure 10:
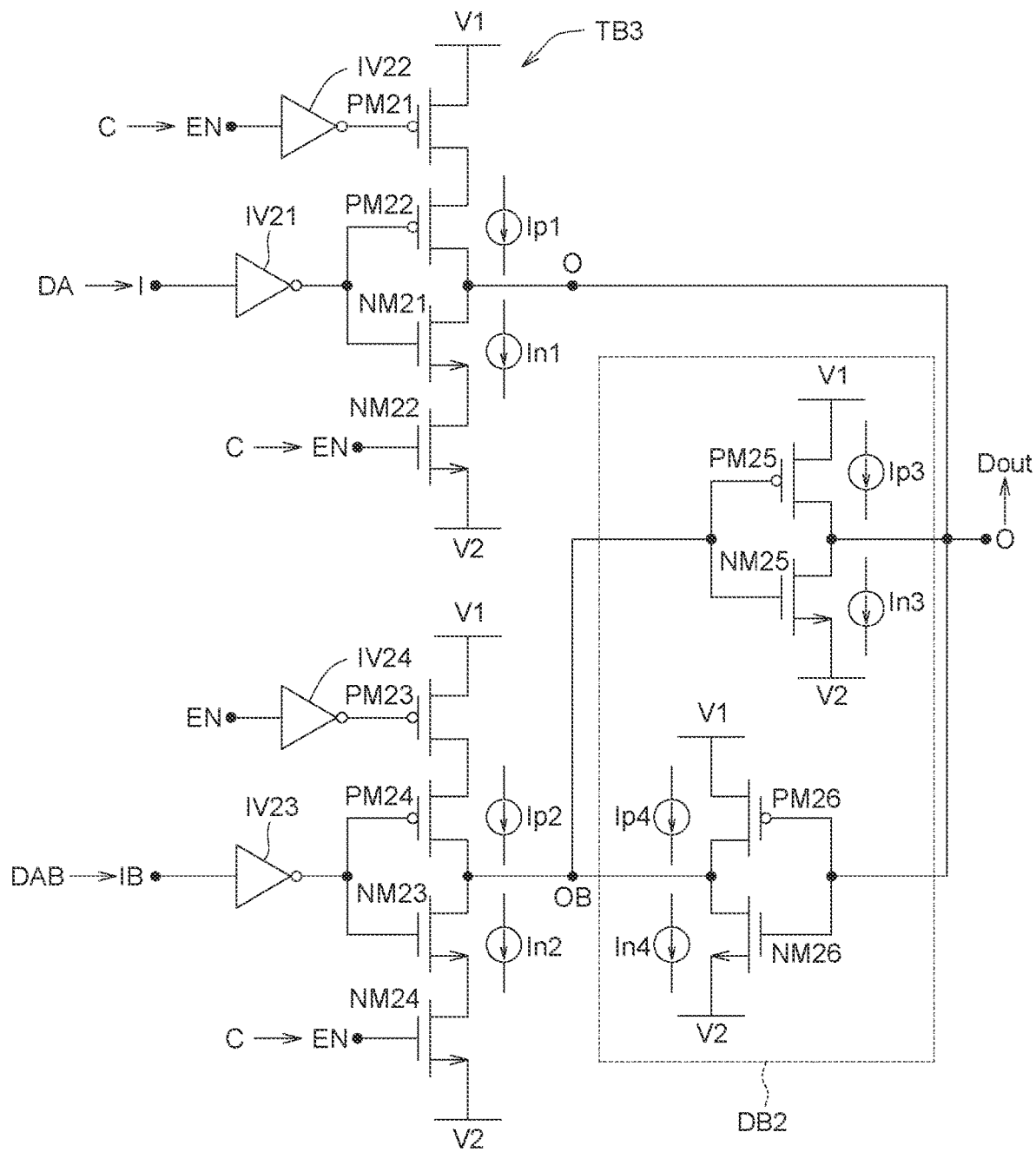
FIG. 10 shows a circuit diagram of the data serializer according to another embodiment.

Please refer to FIG. 10, which shows a circuit diagram of the data serializer DS3 according to another embodiment. In this embodiment, the complementary outputting signal Doutb can be provided without the inverter IV25 of FIG. 7.

Figure 11:
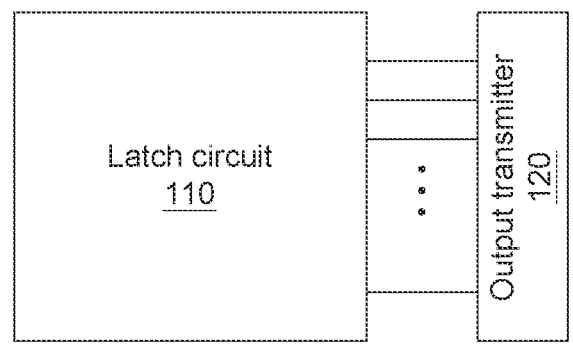
FIG. 11 shows a latch data device according to one embodiment.

The data serializers DS2, DS3 described above are widely used in electric devices and latch data devices. For example, please refer to FIG. 11, which shows a latch data device 100 according to one embodiment. The latch data device 100 includes a latch circuit 110 and an output transmitter 120. The output transmitter 120 is connected to the latch circuit 110. The data stored in the latch circuit 110 is transmitted through the output transmitter 120. The output transmitter 120 includes the data serializer DS2 or the data serializer DS3.

In another embodiment, the data serializer may include two, four or more data buffers. Those embodiments are described as follows.

Figure 12:
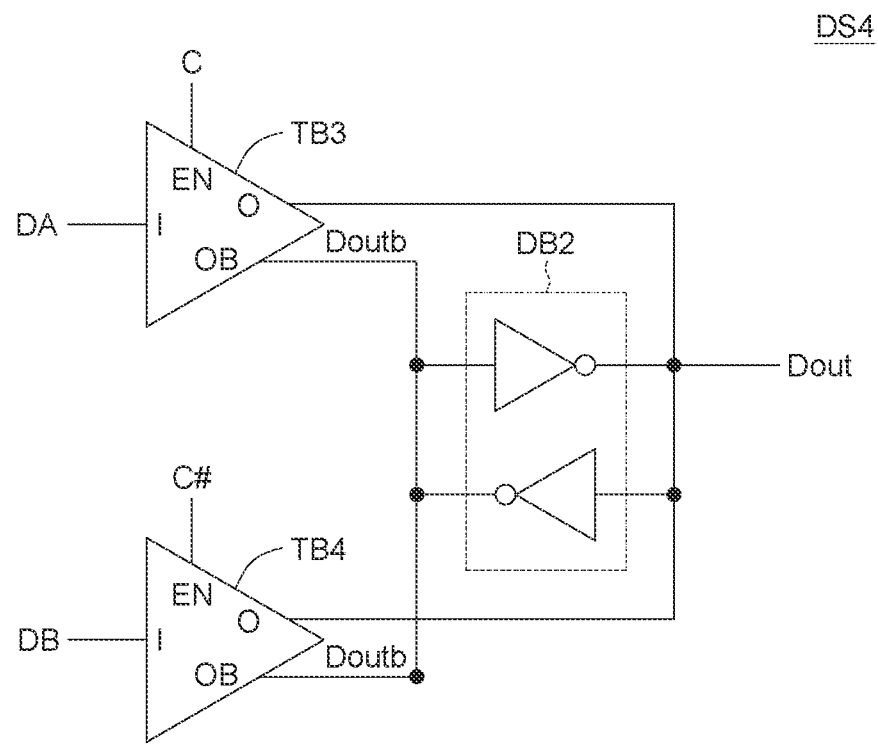
FIG. 12 shows a data serializer according to another embodiment.

Please refer to FIG. 12, which shows a data serializer DS4 according to another embodiment. In FIG. 12, the data serializer DS4 includes two data buffers TB3, TB4 and one de-skew buffer DB2. The structure of each of the data buffers TB3, TB4 is similar to that of the data buffer TB2. Similarities are not repeated here. The data buffer TB3 receives the inputting data DA and the controlling signal C. The data buffer TB4 receives an inputting data DB and a complementary controlling signal C #. The complementary controlling signal C # is complementary to the controlling signal C.

The outputting signal Dout and the complementary outputting signal Doutb, which is complementary to the outputting signal Dout, are formed by the data buffer TB3 when the controlling signal C is at the predetermined level, i.e. "1." The outputting signal Dout and the complementary outputting signal Doutb, which is complementary to the outputting signal Dout, are formed by the data buffer TB4 when the complementary controlling signal C # is at the predetermined level, i.e. "1." The de-skew buffer DB2 receives the complementary outputting signal Doutb to accelerate or slow down forming the outputting signal Dout.

Figure 13:
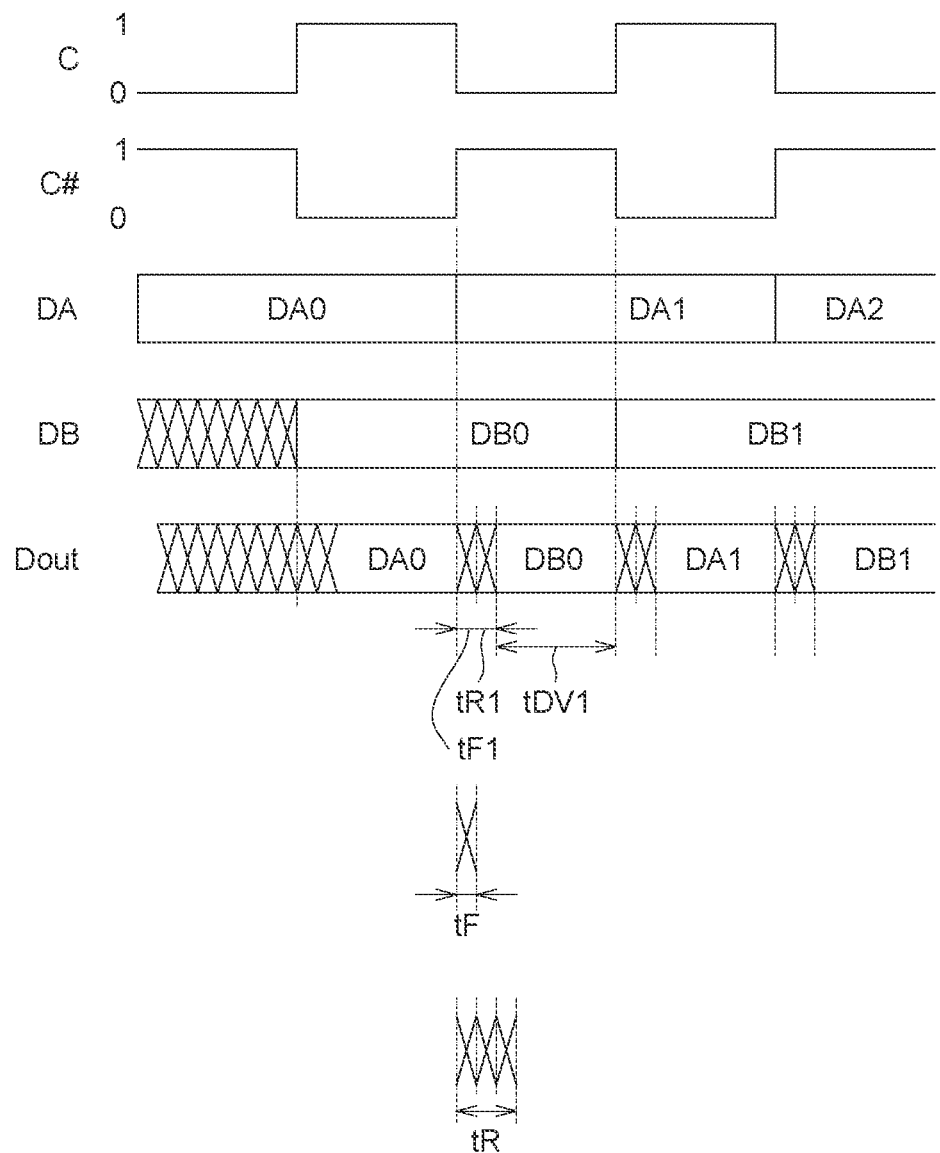
FIG. 13 illustrates the outputting signal Dout of FIG. 12.

Please refer to FIG. 13, which illustrates the outputting signal Dout of FIG. 12. The content of the inputting data DA is "DA0", "DA1", "DA2", etc. The content of the inputting data DB is "DB0", "DB1", etc. At first, the controlling signal C is "1" and the complementary controlling signal C # is "0", so the content of the outputting signal Dout is "DA0". Then, the controlling signal C is "0" and the complementary controlling signal C # is "1", so the content of the outputting signal Dout is "DB0". Next, the controlling signal C is "1" and the complementary controlling signal C # is "0", so the content of the outputting signal Dout is "DA1". If the de-skew buffer DB2 is not used to accelerate or slow down forming the outputting signal Dout, the falling time tF of the outputting signal Dout is much shorter than the raising time tR, in case of that the PMOS transistors work slower than the NMOS transistors.

In this embodiment, the de-skew buffer DB2 receives the complementary outputting signal Doutb to accelerate raising the outputting signal Dout and to slow down falling the outputting signal Dout. Therefore, the raising time tR is shortened to the raising time tR1, and the falling time tF is stretched to the falling time tF1. As such, the size of the data valid window tDV1 can be greatly increased.

Figure 14:
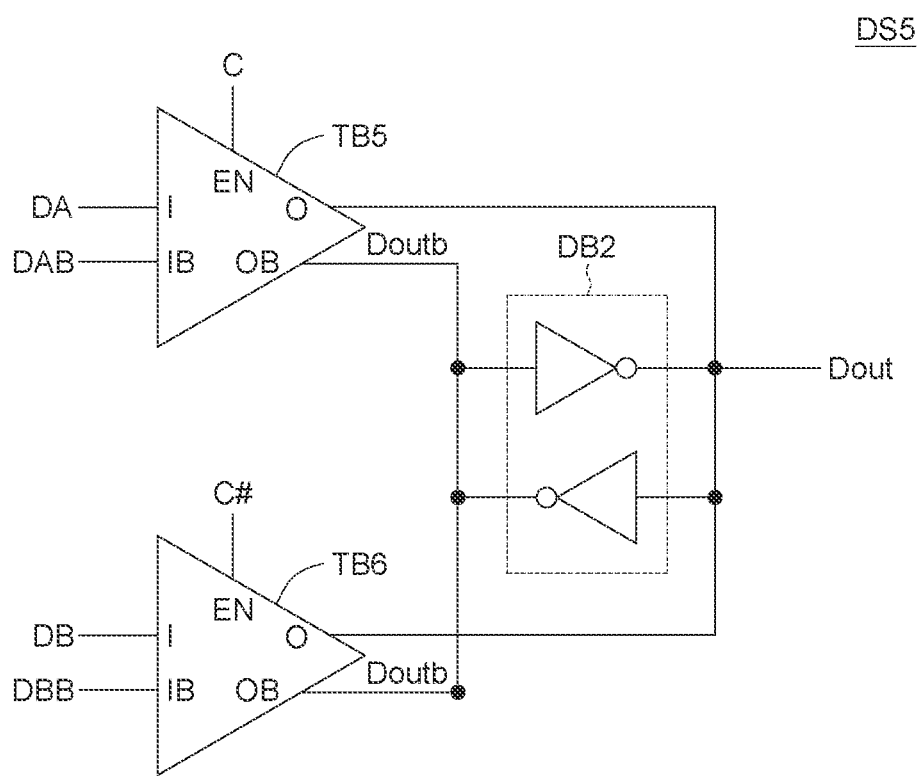
FIG. 14 shows a data serializer according to another embodiment.

Please refer to FIG. 14, which shows a data serializer DS5 according to another embodiment. In FIG. 14, the data serializer DS5 includes two data buffers TB5, TB6 and one de-skew buffer DB2. The structure of each of the data buffers TB5, TB6 is similar to that of the data buffer TB3. Similarities are not repeated here. The data buffer TB5 receives the inputting data DA, the complementary inputting data DAB and the controlling signal C. The data buffer TB6 receives the inputting data DB, a complementary inputting data DBB and the complementary controlling signal C #. The complementary controlling signal C # is complementary to the controlling signal C.

The outputting signal Dout and the complementary outputting signal Doutb, which is complementary to the outputting signal Dout, are formed by the data buffer TB5 when the controlling signal C is at the predetermined level, i.e. "1." The outputting signal Dout and the complementary outputting signal Doutb, which is complementary to the outputting signal Dout, are formed by the data buffer TB6 when the complementary controlling signal C # is at the predetermined level, i.e. "1." The de-skew buffer DB2 receives the complementary outputting signal Doutb to accelerate or slow down forming the outputting signal Dout.

Figure 15:
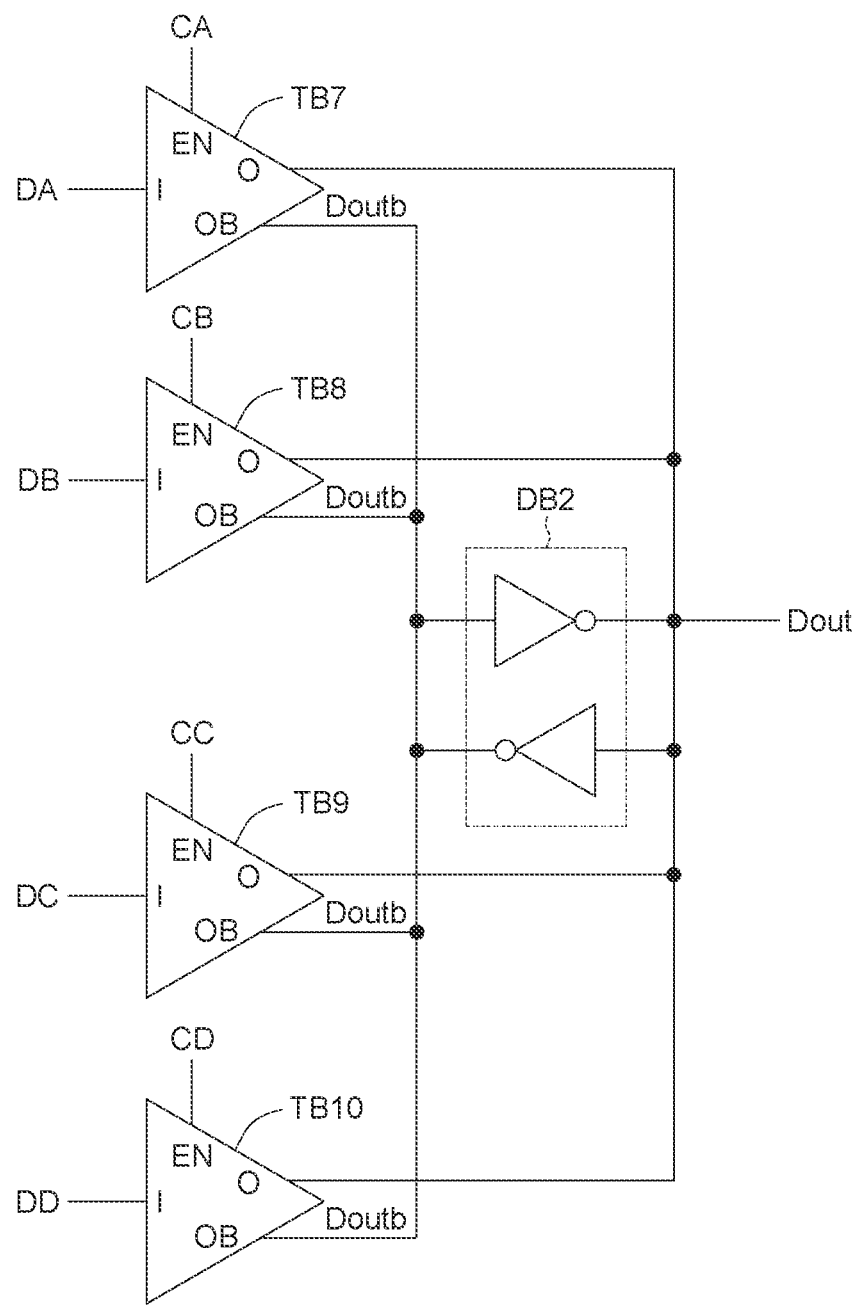
FIG. 15 shows a data serializer according to another embodiment.

Please refer to FIG. 15, which shows a data serializer DS6 according to another embodiment. In FIG. 15, the data serializer DS6 includes four data buffers TB7, TB8, TB9, TB10 and one de-skew buffer DB2. The structure of each of the data buffers TB7, TB8, TB9, TB10 is similar to that of the data buffer TB2. Similarities are not repeated here. The data buffer TB7 receives the inputting data DA and a controlling signal CA. The data buffer TB8 receives the inputting data DB and a controlling signal CB. The data buffer TB9 receives an inputting data DC and a controlling signal CC. The data buffer TB10 receives an inputting data DD and a controlling signal CD. The controlling signals CA, CB, CC, CD are taken turns to be "1" in one cycle.

The outputting signal Dout and the complementary outputting signal Doutb are formed by the data buffer TB7 when the controlling signal CA is "1." The outputting signal Dout and the complementary outputting signal Doutb are formed by the data buffer TB8 when the controlling signal CB is "1." The outputting signal Dout and the complementary outputting signal Doutb are formed by the data buffer TB9 when the controlling signal CC is "1." The outputting signal Dout and the complementary outputting signal Doutb are formed by the data buffer TB10 when the controlling signal CD is "1." The de-skew buffer DB2 receives the complementary outputting signal Doutb to accelerate or slow down forming the outputting signal Dout.

Figure 16:
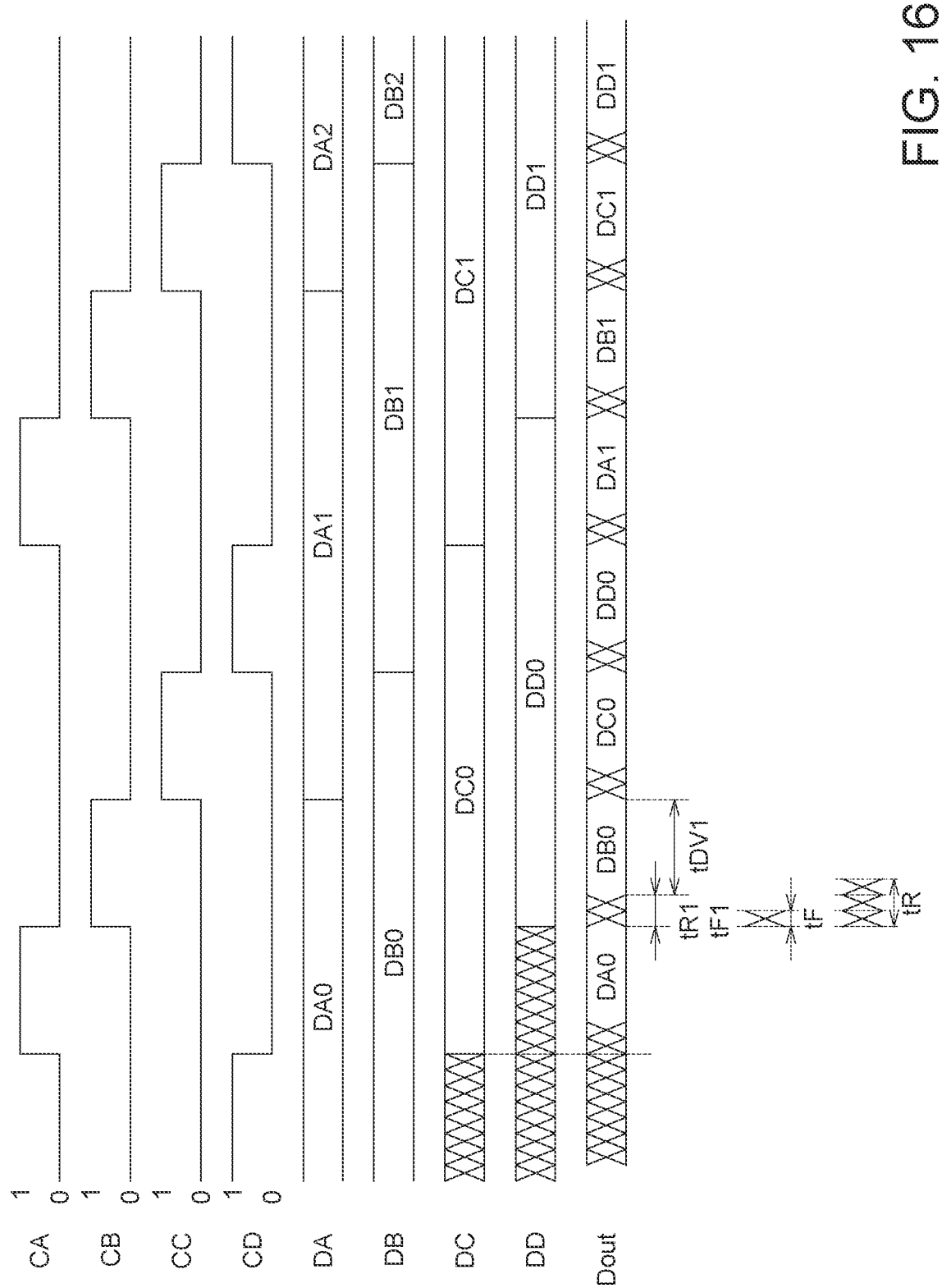
FIG. 16 illustrates the outputting signal of FIG. 15.

Please refer to FIG. 16, which illustrates the outputting signal Dout of FIG. 15. The content of the inputting data DA is "DA0", "DA1", "DA2", etc. The content of the inputting data DB is "DB0", "DB1", "DB2", etc. The content of the inputting data DC is "DC0", "DC1", etc. The content of the inputting data DD is "DD0", "DD1", etc. At first, the controlling signal CA is "1" and the controlling signals CB, CC, CD are "0", so the content of the outputting signal Dout is "DA0". Then, the controlling signal CB is "1" and the controlling signals CA, CC, CD are "0", so the content of the outputting signal Dout is "DB0". Next, the controlling signal CC is "1" and the controlling signals CA, CB, CD are "0", so the content of the outputting signal Dout is "DC0". Afterwards, the controlling signal CD is "1" and the controlling signals CA, CB, CC are "0", so the content of the outputting signal Dout is "DD0". If the de-skew buffer DB2 is not used to accelerate or slow down forming the outputting signal Dout, the falling time tF of the outputting signal Dout is much shorter than the raising time tR, in case of that the PMOS transistors work slower than the NMOS transistors.

In this embodiment, the de-skew buffer DB2 receives the complementary outputting signal Doutb to accelerate raising the outputting signal Dout and to slow down falling the outputting signal Dout. Therefore, the raising time tR is shortened to the raising time tR1, and the falling time tF is stretched to the falling time tF1. As such, the size of the data valid window tDV1 can be greatly increased.

Figure 17:
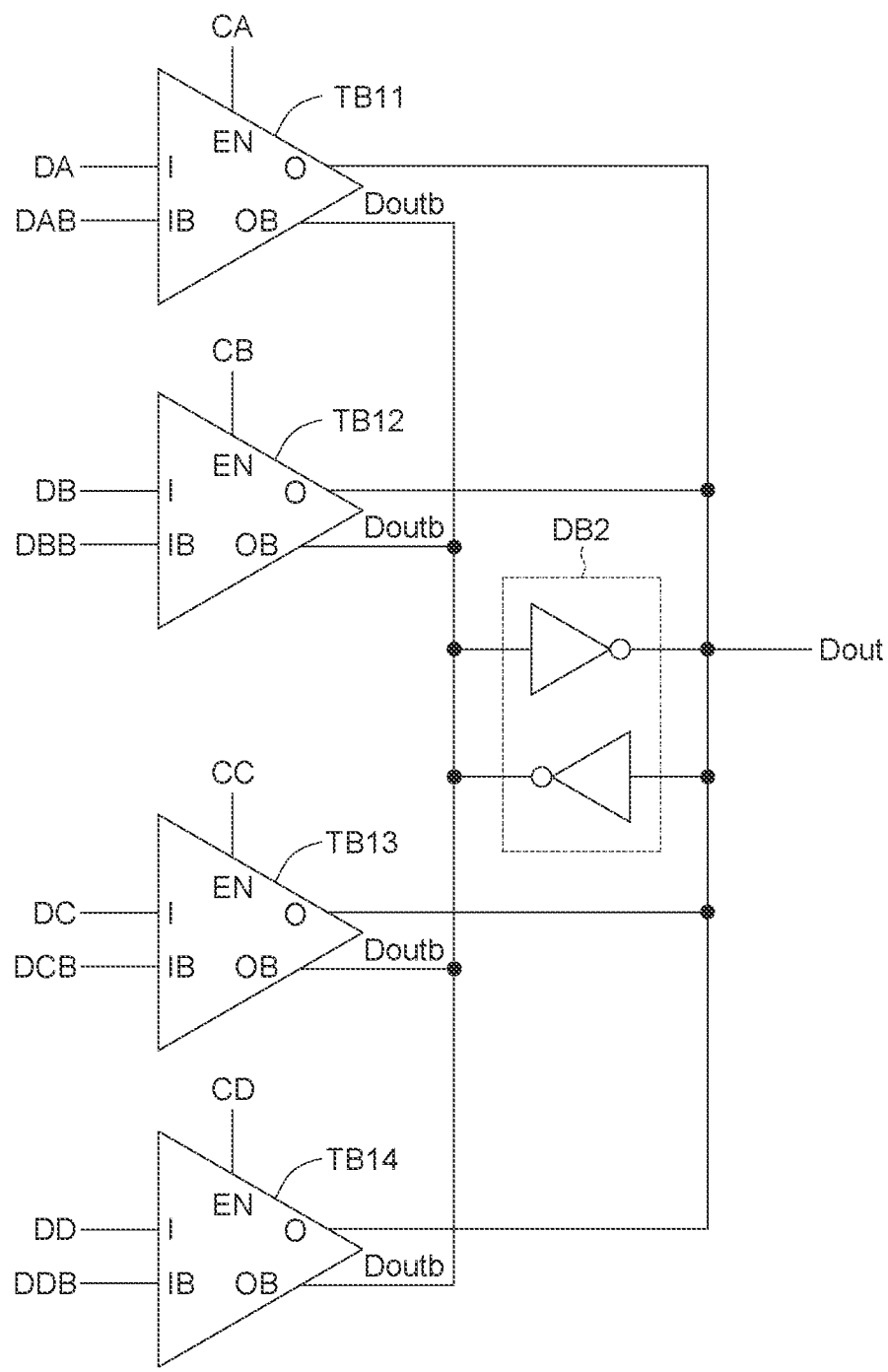
FIG. 17 shows a data serializer according to another embodiment.

Please refer to FIG. 17, which shows a data serializer DS7 according to another embodiment. In FIG. 17, the data serializer DS7 includes four data buffers TB11, TB12, TB13, TB14 and one de-skew buffer DB2. The structure of each of the data buffers TB11, TB12, TB13, TB14 is similar to that of the data buffer TB3. Similarities are not repeated here. The data buffer TB11 receives the inputting data DA, the complementary inputting data DAB and the controlling signal CA. The data buffer TB12 receives the inputting data DB, a complementary inputting data DBB and the controlling signal CB. The data buffer TB13 receives the inputting data DC, a complementary inputting data DCB and the controlling signal CC. The data buffer TB14 receives the inputting data DD, a complementary inputting data DDB and the controlling signal CD.

The outputting signal Dout and the complementary outputting signal Doutb are formed by the data buffer TB11 when the controlling signal CA is "1." The outputting signal Dout and the complementary outputting signal Doutb are formed by the data buffer TB12 when the controlling signal CB is at "1." The outputting signal Dout and the complementary outputting signal Doutb are formed by the data buffer TB13 when the controlling signal CC is at "1." The outputting signal Dout and the complementary outputting signal Doutb are formed by the data buffer TB14 when the controlling signal CD is at "1." The de-skew buffer DB2 receives the complementary outputting signal Doutb to accelerate or slow down forming the outputting signal Dout.

Base on above, the de-skew buffer DB2 is used to receive the complementary outputting signal Doutb to accelerate or slow down forming the outputting signal Dout. Therefore, the raising time tR1, the falling time tF1 of the outputting signal Dout and the raising time tR2, the falling time tF2 of the complementary outputting signal Doutb become substantially identical. Because the difference between the raising time tR1 and the falling time tF1 is greatly reduced, so the size of a data valid window tDV1 can be greatly increased.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A data serializer, comprising:
   at least one data buffer, at least receiving an inputting data and a controlling signal, wherein an outputting signal and a complementary outputting signal, which is complementary to the outputting signal, are formed when the controlling signal is at a predetermined level; and
   a de-skew buffer, receiving the complementary outputting signal to accelerate or slow down forming the outputting signal,
   wherein the de-skew buffer includes a PMOS transistor connected to the data buffer, rising of the outputting signal is slower than falling of the outputting signal, and the PMOS transistor of the de-skew buffer is turned on to pull the outputting signal high.

2. The data serializer according to claim 1, wherein the PMOS transistor of the de-skew buffer is turned on by the complementary outputting signal.

3. The data serializer according to claim 2, wherein the de-skew buffer includes another PMOS transistor connected to the data buffer, and the another PMOS transistor of the de-skew buffer is turned on to inhibit the complementary outputting signal.

4. The data serializer according to claim 3, wherein the another PMOS transistor of the de-skew buffer is turned on by the outputting signal.

5. The data serializer according to claim 1, wherein the data buffer includes a PMOS transistor connected to the de-skew buffer, and rising of the outputting signal is formed by turning on the PMOS transistor of the data buffer.

6. The data serializer according to claim 5, wherein the data buffer includes another PMOS transistor connected to the de-skew buffer, and rising of the complementary outputting signal is formed by turning on the another PMOS transistor of the data buffer.

7. The data serializer according to claim 1, wherein the data buffer includes a NMOS transistor connected to the de-skew buffer, and falling of the outputting signal is formed by turning on the NMOS transistor of the data buffer.

8. The data serializer according to claim 7, wherein the data buffer includes another NMOS transistor connected to the de-skew buffer, and falling of the complementary outputting signal is formed by turning on another NMOS transistor of the data buffer.

9. The data serializer according to claim 1, wherein the de-skew buffer includes a NMOS transistor connected to the data buffer, rising of the outputting signal is faster than falling of the outputting signal, and the NMOS transistor of the de-skew buffer is turned on to pull the outputting signal low.

10. The data serializer according to claim 9, wherein the NMOS transistor of the de-skew buffer is turned on by the complementary outputting signal.

11. The data serializer according to claim 10, wherein the de-skew buffer includes another NMOS transistor connected to the data buffer, the another NMOS transistor of the de-skew buffer is turned on to inhibit the complementary outputting signal.

12. The data serializer according to claim 11, wherein the another NMOS transistor of the de-skew buffer is turned on by the outputting signal.

13. The data serializer according to claim 1, wherein the data buffer further receives a complementary inputting data, the outputting signal is formed according to the inputting data, and the complementary outputting signal is formed according to the complementary inputting data.

14. A latch data device, comprising:
a latch circuit; and
an output transmitter, connected to the latch circuit, wherein the output transmitter includes:
  a data serializer, comprising:
    at least one data buffer, receiving an inputting data and a controlling signal, wherein an outputting signal and a complementary outputting signal, which is complementary to the outputting signal, are formed when the controlling signal is at a predetermined level; and
  a de-skew buffer, receiving the complementary outputting signal to accelerate or slow down forming the outputting signal,
wherein the de-skew buffer includes a PMOS transistor connected to the data buffer, rising of the outputting signal is slower than falling of the outputting signal, and the PMOS transistor of the de-skew buffer is turned on to pull the outputting signal high.

15. The latch data device according to claim 14, wherein the de-skew buffer includes another PMOS transistor connected to the data buffer, and the another PMOS transistor of the de-skew buffer is turned on to inhibit the complementary outputting signal.

16. The latch data device according to claim 14, wherein the data buffer further receives a complementary inputting data, the outputting signal is formed according to the inputting data, and the complementary outputting signal is formed according to the complementary inputting data.

17. The latch data device according to claim 14, wherein a quantity of the at least one data buffer is 2 or 4.

18. A controlling method of a data serializer, wherein the data serializer includes at least one data buffer and a de-skew buffer, and the controlling method comprises:
receiving, by the data buffer, an inputting data and a controlling signal;
forming, by the data buffer, an outputting signal and a complementary outputting signal, which is complementary to the outputting signal, are formed when the controlling signal is at a predetermined level; and
receiving, by the de-skew buffer, the complementary outputting signal to accelerate or slow down forming the outputting signal,
wherein the de-skew buffer includes a PMOS transistor connected to the data buffer, rising of the outputting signal is slower than falling of the outputting signal, and the PMOS transistor of the de-skew buffer is turned on to pull the outputting signal high.

19. The data serializer according to claim 1, wherein each of the at least one data buffer at least includes a first PMOS transistor, a second PMOS transistor, a first NMOS transistor and a second NMOS transistor, and the first PMOS transistor, the second PMOS transistor, the first NMOS transistor and the second NMOS transistor are connected in series;
wherein when the controlling signal is at the predetermined level and the inputting data is a first value, the first PMOS transistor and the second PMOS transistor are turned on, so that the outputting signal is raised to a first level;
wherein when the controlling signal is at the predetermined level and the inputting data is a second value, the first NMOS transistor and the second NMOS transistor are turned on, so that the outputting signal is fallen to a second level;
wherein when the first PMOS transistor and the second PMOS transistor work slower than the first NMOS transistor and the second NMOS transistor, the de-skew buffer is configured to pull the outputting signal and the complementary outputting signal high, so that forming the outputting signal is accelerated and forming the complementary outputting signal is slowed down; and
wherein when the first PMOS transistor and the second PMOS transistor work faster than the first NMOS transistor and the second NMOS transistor, the de-skew buffer is configured to pull the outputting signal and the complementary outputting signal down, so that forming the outputting signal is slowed down and forming the complementary outputting signal is accelerated.

20. The latch data device according to claim 14, wherein each of the at least one data buffer at least includes a first PMOS transistor, a second PMOS transistor, a first NMOS transistor and a second NMOS transistor, and the first PMOS transistor, the second PMOS transistor, the first NMOS transistor and the second NMOS transistor are connected in series;
- wherein when the controlling signal is at the predetermined level and the inputting data is a first value, the first PMOS transistor and the second PMOS transistor are turned on, so that the outputting signal is raised to a first level;
- wherein when the controlling signal is at the predetermined level and the inputting data is a second value, the first NMOS transistor and the second NMOS transistor are turned on, so that the outputting signal is fallen to a second level;
- wherein when the first PMOS transistor and the second PMOS transistor work slower than the first NMOS transistor and the second NMOS transistor, the de-skew buffer is configured to pull the outputting signal and the complementary outputting signal high, so that forming the outputting signal is accelerated and forming the complementary outputting signal is slowed down; and
- wherein when the first PMOS transistor and the second PMOS transistor work faster than the first NMOS transistor and the second NMOS transistor, the de-skew buffer is configured to pull the outputting signal and the complementary outputting signal down, so that forming the outputting signal is slowed down and forming the complementary outputting signal is accelerated.

21. The controlling method according to claim 18, wherein each of the at least one data buffer at least includes a first PMOS transistor, a second PMOS transistor, a first NMOS transistor and a second NMOS transistor, and the first PMOS transistor, the second PMOS transistor, the first NMOS transistor and the second NMOS transistor are connected in series;
- wherein when the controlling signal is at the predetermined level and the inputting data is a first value, the first PMOS transistor and the second PMOS transistor are turned on, so that the outputting signal is raised to a first level;
- wherein when the controlling signal is at the predetermined level and the inputting data is a second value, the first NMOS transistor and the second NMOS transistor are turned on, so that the outputting signal is fallen to a second level;
- wherein when the first PMOS transistor and the second PMOS transistor work slower than the first NMOS transistor and the second NMOS transistor, the de-skew buffer is configured to pull the outputting signal and the complementary outputting signal high, so that forming the outputting signal is accelerated and forming the complementary outputting signal is slowed down; and
- wherein when the first PMOS transistor and the second PMOS transistor work faster than the first NMOS transistor and the second NMOS transistor, the de-skew buffer is configured to pull the outputting signal and the complementary outputting signal down, so that forming the outputting signal is slowed down and forming the complementary outputting signal is accelerated.

\* \* \* \* \*